US007252794B2

(12) United States Patent
Suzuki

(10) Patent No.: US 7,252,794 B2
(45) Date of Patent: Aug. 7, 2007

(54) ELECTROCONDUCTIVE OXIDE SINTERED COMPACT, SPUTTERING TARGET COMPRISING THE SINTERED COMPACT AND METHODS FOR PRODUCING THEM

(75) Inventor: Ryo Suzuki, Ibaraki (JP)

(73) Assignee: Nippon Mining & Metals Co., Ltd. (JP)

( * ) Notice: Subject to any disclaimer, the term of this patent is extended or adjusted under 35 U.S.C. 154(b) by 312 days.

(21) Appl. No.: 10/522,263

(22) PCT Filed: Jun. 12, 2003

(86) PCT No.: PCT/JP03/07483

§ 371 (c)(1),
(2), (4) Date: Jan. 25, 2005

(87) PCT Pub. No.: WO2004/016824

PCT Pub. Date: Feb. 26, 2004

(65) Prior Publication Data
US 2006/0071197 A1    Apr. 6, 2006

(30) Foreign Application Priority Data
Aug. 6, 2002    (JP) ............................. 2002-228165

(51) Int. Cl.
*H01B 1/08* (2006.01)
(52) U.S. Cl. ................................................. 252/518.1
(58) Field of Classification Search ............. 252/518.1; 426/594.16
See application file for complete search history.

(56) References Cited
U.S. PATENT DOCUMENTS 5,624,542 A    4/1997    Shen et al. ................. 204/283
5,995,359 A    11/1999    Klee et al. .................. 361/305
6,132,487 A    10/2000    Mori .............................. 75/247
6,284,013 B1    9/2001    Shindo et al. ............. 75/10.28
6,528,442 B1    3/2003    Kuwano et al. ............... 501/41
6,555,864 B1    4/2003    Cross et al. ................. 257/310
6,843,975 B1    1/2005    Suzuki .................. 423/594.16

FOREIGN PATENT DOCUMENTS

| JP | 6-056503 | 3/1994 |
|---|---|---|
| JP | 10-330924 | 12/1998 |
| JP | 2000-001774 | 1/2000 |
| JP | 2000-128638 | 5/2000 |
| JP | 2000-247739 | * 9/2000 |
| JP | 2002-193668 | 7/2002 |
| JP | 2002-211978 | 7/2002 |
| WO | WO 02/051769 A1 | * 7/2002 |

OTHER PUBLICATIONS

Patent Abstracts of Japan, 1 page English Abstract of JP 2002-193668, Jul. 2002.

(Continued)

*Primary Examiner*—Mark Kopec
(74) *Attorney, Agent, or Firm*—Howson & Howson LLP

(57) ABSTRACT

A $SrRuO_3$ conductive oxide sintered body characterized in that the relative density is 93% or more. By improving the additive amount and sintering conditions of $Bi_2O_3$, the present invention seeks to improve the relative density of a $SrRuO_3$ conductive oxide sintered body, and to provide a conductive oxide sintered body capable of suppressing the generation of particles during sputtering upon forming a thin film and improving the quality and production yield; a sputtering target formed from such sintered body; and the manufacturing method thereof.

12 Claims, 1 Drawing Sheet

OTHER PUBLICATIONS

Patent Abstracts of Japan, 1 page English Abstract of JP 2000-247739, Sep. 2000.

esp@cenet database, 1 page English Abstract of JP 6-056503, Mar. 1994.

esp@cenet database, 1 page English Abstract of JP 2002-211978, Jul. 2002.

Patent Abstracts of Japan, 1 page English Abstract of JP 2000-128638, Jul. 2002.

Patent Abstracts of Japan, 1 page English Abstract of JP 2000-001774, Sep. 2000.

Patent Abstracts of Japan, 1 page English Abstract of JP 10-330924, Sep. 2000.

* cited by examiner

ELECTROCONDUCTIVE OXIDE SINTERED COMPACT, SPUTTERING TARGET COMPRISING THE SINTERED COMPACT AND METHODS FOR PRODUCING THEM

BACKGROUND OF THE INVENTION

The present invention pertains to a conductive oxide sintered body suitable as the electrode of a dielectric thin film memory for the likes of a DRAM or FRAM, a sputtering target formed from such a sintered body, and the manufacturing method thereof.

Conventionally, a Pt electrode has been used as the electrode of a dielectric thin film memory for the likes of a DRAM or FRAM. Nevertheless, in light of indications that the ferroelectric thin film deteriorates with hydrogen as a result of the Pt electrode catalytic activity, several conductive oxides have been proposed as a replacement for this Pt electrode. As such conductive oxide, considered may be $SrRuO_3$, $SrIrO_3$, $CaRuO_3$, $BaRuO_3$, $Sr_2RuO_4$, $Sr_2IrO_4$ and so on.

Meanwhile, although PTZ ($PbZr_xTi_{1-x}O_3$) or BST ($BaSrTi_3$) is being used as the dielectric material, the foregoing conductive oxides are considered to be extremely promising since they are compatible therewith in terms of the material quality and have low bulk resistance.

Nevertheless, each of the conductive oxides listed above has a problem in that the sintering density thereof is significantly low since the sinterability is inferior. With the sputtering target obtained from this kind of low density sintering target, since the pore shape in such target is of an open pore, abrasive cutting powder or the like remains during the target processing, and there is a problem in that particles are generated considerably during sputtering upon forming a thin film for the electrode.

Moreover, a target having a low sintering density has a drawback in that cracks and chips occur easily during the manufacturing process, operation or sputtering which result in decrease of the product yield, and, since the sputtering power cannot be increased during sputtering, the mass production cost deteriorates thereby.

In light of the above, there has been a proposal of adding a sintering auxiliary agent for increasing the sintering density. For example, the publication of Japanese Patent Laid Open Publication No. 2000-247739 describes an attempt of increasing the relative density to 85% to 90% by adding 0.001 mol % to 0.5 mol % of $Bi_2O_3$.

Nevertheless, even if the relative density is increased as described in the foregoing publication, the maximum relative density is still 90% or less, and it cannot be said that a satisfactory increase in the target density has been obtained.

Therefore, numerous particles are still generated during sputtering upon forming a thin film, and it has not been possible to effectively suppress the deterioration in quality and production yield heretofore.

SUMMARY OF THE INVENTION

In order to overcome the foregoing problems, the present invention aims to seek, by improving the additive amount and sintering conditions of $Bi_2O_3$, the improvement in the relative density of a $SrRuO_3$ conductive oxide sintered body, and to provide a conductive oxide sintered body capable of suppressing the generation of particles during sputtering upon forming a thin film and improving the quality and production yield; a sputtering target formed from such sintered body; and the manufacturing method thereof.

The present invention provides a $SrRuO_3$ conductive oxide sintered body characterized in that the relative density is 93% or more; the resistivity is 500 μΩcm or less or 300 μΩcm or less. The conductive oxide sintered body contains 0.3 mol % to 1.2 mol % of $Bi_2O_3$ or 0.5 mol % (and above) to 1.0 mol % of $Bi_2O_3$.

The present invention further provides a sputtering target formed from a $SrRuO_3$ conductive oxide sintered body characterized in that the relative density is 93% or more; the resistivity is 500 μΩcm or less or 300 μΩcm or less. The sputtering target formed from a conductive oxide sintered body contains 0.3 mol % to 1.2 mol % of $Bi_2O_3$ or 0.5 mol % (and above) to 1.0 mol % of $Bi_2O_3$.

The present invention additionally provides a manufacturing method of a $SrRuO_3$ conductive oxide sintered body or a sputtering target formed from the sintered body, characterized in that 0.3 mol % to 1.2 mol % of $Bi_2O_3$ is added as a sintering auxiliary upon manufacturing the $SrRuO_3$ conductive oxide sintered body; or 0.5 mol % (and above) to 1.0 mol % of $Bi_2O_3$ is added as a sintering auxiliary upon manufacturing the $SrRuO_3$ conductive oxide sintered body. The manufacturing method of a $SrRuO_3$ conductive oxide sintered body or a sputtering target formed from the sintered body is characterized in that sintering is performed at a sintering temperature of 1400 to 1700° C. upon manufacturing the $SrRuO_3$ conductive oxide sintered body.

DETAILED DESCRIPTION OF THE INVENTION

Figure 1:
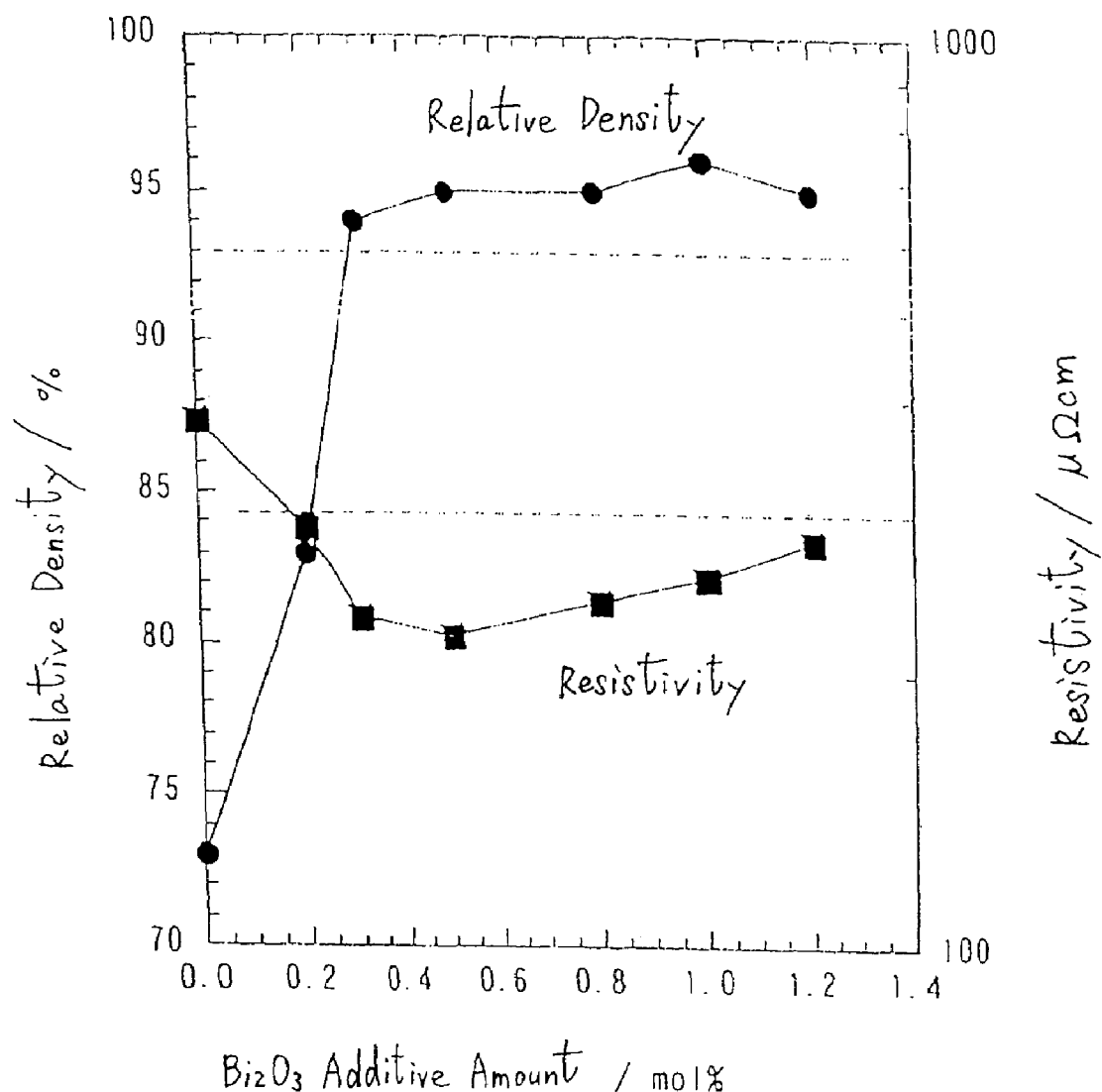
FIG. 1 is a diagram showing the relationship between the $Bi_2O_3$ additive amount and resistivity/relative density when sintering is performed at 1700° C.

The present invention relates to a perovskite $SrRuO_3$ conductive oxide, as the sputtering target material, capable of being used for forming a thin film electrode for a dielectric thin film memory for the likes of a DRAM or FRAM, and, as a result: of continuously seeking improvement in the increased density of a $SrRuO_3$ conductive oxide, it has become possible to obtain a $SrRuO_3$ conductive oxide sintered body and sputtering target having a relative density of 93% or more. The present invention also provides the manufacturing method thereof.

The $SrRuO_3$ conductive oxide sintered body and sputtering target of the present invention is capable of obtaining materials in which the resistivity is 500 μΩcm or less, and even where the resistivity is 300 μΩcm or less, and favorable conductivity can be obtained as the electrode material. When the relative density increases, the resistivity tends to decrease.

In conventional technology, a $SrRuO_3$ conductive oxide in which the resistivity is 500 μΩcm or less and having a relative density of 93% or more does not exist, and this has been achieved for the first time with the present invention.

Upon manufacturing the $SrRuO_3$ conductive oxide sintered body of the present invention, 0.3 mol % to 1.2 mol % of $Bi_2O_3$ is added as an auxiliary agent. Preferably, sintering is performed upon adding 0.5 mol % (and above) to 1.0 mol % of $Bi_2O_3$. Thereby, 0.3 mol % to 1.2 mol % of $Bi_2O_3$, preferably 0.5 mol % (and above) to 1.0 mol % of $Bi_2O_3$ is contained in the $SrRuO_3$ conductive oxide sintered body and sputtering target.

In order to improve the sinterability and obtain a high density $SrRuO_3$ conductive oxide sintered body, it is necessary to added 0.3 mol % or more of $Bi_2O_3$, and preferably more than 0.5 mol % of $Bi_2O_3$ is added. If less than 0.3 mol % of $Bi_2O_3$ is added, it is not possible to achieve a density of 93% or more.

However, when the $Bi_2O_3$ contained in the $SrRuO_3$ conductive oxide sintered body and sputtering target increases, the $Bi_2O_3$ contained in the sputtering film will increase, and the resistivity tends to increase. Moreover, when the amount of addition exceeds 1.2 mol % a second layer is formed in the sputtering film, this generates a Bi compound at the boundary face with the BSTO film or PZT film, and causes a problem of deteriorating the dielectric property. In consideration of the above, the upper limit of the additive amount has been set to 1.2 mol % and preferably to 1.0 mol %.

Further, for the manufacturing of a $SrRuO_3$ conductive oxide sintered body, it is desirable that sintering is performed at a sintering temperature of 1400 to 1700° C. By setting the sintering temperature to 1400° C., the sinterability may be improved significantly, and a high density target can be obtained thereby.

When the sintering temperature exceeds 1700° C., since the evaporation of $RuO_2$ will become severe, $Sr_2RuO_4$ will be generated, and conductivity will deteriorate as a result thereof, it is necessary to maintain the sintering temperature to 1700° C. or less.

With the high density $SrRuO_3$ conductive oxide sintered body target having a relative density of 93% or more obtained as a result of the above, since the pore figuration in the target is of a closed pore (no remaining open pores), abrasive cutting powder or the like will not remain during the target processing, and it is thereby possible to significantly reduce the generation of particles upon forming a thin film for the electrode with sputtering.

A high density target yields an effect of reducing the resistivity as described above, and provides a significant advantage in that the production yield can be improved without generating cracks or chips during the manufacturing process, operation or sputtering. Further, there is another effect in that the production cost will improve since the sputtering power can be increased during sputtering.

EXAMPLES AND COMPARATIVE EXAMPLES

Next, the present invention is described based on the Examples. The Examples are for facilitating the understanding of the invention, and the present invention is not in any way limited thereby. In other words, the present invention covers other Examples and modifications based on the technical spirit of the invention.

Examples 1 to 3, Comparative Examples 1 and 2

With $SrCO_3$ powder having a purity of 5N (99.999%) and $RuO_2$ powder having a purity of 4N (99.99%) as the starting material, after weighing both powders such that the mol ratio becomes 1:1, the powders were mixed in a ball mill with purified water as the medium. After dehydrating the obtained slurry, thermal synthesis was performed in the atmosphere under the conditions of 1000° C.×10 hours, and a $SrRuO_3$ single phase powder was prepared thereby.

Next, individual samples were prepared by adding 0 (additive free), 0.2, 0.5, 0.8, 1.0 and 1.2 mol % of $Bi_2O_3$ powder having a purity of 4N to the $SrRuO_3$ powder, and this was mixed/pulverized in the ball mill once again.

After dehydrating this mixed slurry, an organic binder was added for preforming this with uniaxial press molding, and this was thereafter CIP molded at a pressure of 1500 kg/cm². Each of the molds was set inside a vented alumina container, and sintered at 1300° C. (Comparative Example 1), 1400° C. (Example 1), 1600° C. (Example 2), 1700° C. (Example 3) and 1750° C. (Comparative Example 2).

After sintering, the $RuO_2$ defective layers were removed from the surface of the sintered body, and the density and resistivity were thereafter measured. The results are shown in Table 1.

TABLE 1

| | Sintering Temperature (° C.) | | Bi2O3 Additive Amount (mol %) | | | | | | |
|---|---|---|---|---|---|---|---|---|---|
| | | | 0.0 | 0.2 | 0.3 | 0.5 | 0.8 | 1.0 | 1.2 |
| Comparative Example 1 | 1300 | Relative Density (%) | 55 | 72 | 84 | 88 | 90 | 91 | 90 |
| | | Resistivity Judgment | x | x | ○ | ○ | ○ | ○ | ○ |
| Example 1 | 1400 | Relative Density (%) | 62 | 75 | 93 | 94 | 95 | 97 | 97 |
| | | Resistivity Judgment | x | x | ○ | ○ | ○ | ○ | ○ |
| Example 2 | 1600 | Relative Density (%) | 68 | 80 | 94 | 95 | 96 | 97 | 97 |
| | | Resistivity Judgment | x | ○ | ○ | ○ | ○ | ○ | ○ |
| Example 3 | 1700 | Relative Density (%) | 73 | 83 | 94 | 95 | 95 | 96 | 95 |
| | | Resistivity Judgment | x | ○ | ○ | ○ | ○ | ○ | ○ |
| Comparative Example 2 | 1750 | Relative Density (%) | 69 | 75 | 91 | 92 | 93 | 91 | 92 |
| | | Resistivity Judgment | x | x | x | x | ○ | x | x |

Resistivitiy Judgment: ○ represents 300 μm Ω cm or less, x represents 300 mm Ω cm or more.

In Table 1, resistivity of 300 μΩcm or less is shown with a circle. Even in Comparative Example 1 where the sintering temperature is 1300° C., when the additive amount of $Bi_2O_3$ is large, the values indicate 300 μΩcm or less, but it is clear that a sufficient density of 93% or more could not be obtained.

Nevertheless, when the sintering was performed between 1400° C. to 1700° C. as in Examples 1 to 3, a sufficient density of 93% or more was obtained. As shown in Comparative Example 2, although a high density sintered body of 93% was obtained partially with a sintering temperature of 1750° C., as described above, the evaporation of $RuO_2$ becomes severe when the sintering temperature exceeds 1700° C., and it is necessary to avoid this since there is a problem in that $Sr_2RuO_4$ will arise and change the property of the film.

In the relationship between the additive amount of $Bi_2O_3$ and the relative density when sintering is performed at 1700° C., as shown in FIG. 1, the relative density becomes 93% or more when the additive amount is 0.3 mol % or more, and the relative density tends to increase together with the increase in the added $Bi_2O_3$.

Moreover, FIG. 1 also shows the relationship between the additive amount of $Bi_2O_3$ and the resistivity when sintering is performed at 1700° C. As shown in FIG. 1, it is possible to achieve resistivity of 300 μΩcm or less when the additive amount of $Bi_2O_3$ is 0.2 mol % or more.

Next, each of the sintered bodies with an additive amount of 0.2, 0.3 and 0.8 mol % of $Bi_2O_3$ sintered at 1700° C. was machine processed to prepare a target of φ200 m×6 mmt.

Sputtering was performed with the targets prepared above, and particles on a six-inch wafer were measured. As a result, the number of particles having a measurement of 0.3 μm or more was 89, 14 and 13, respectively.

The relative density of each of the targets within the scope of the present invention was 93% or more, and the number of particles was 20 or less. And the improvement in the relative density was achieved under the optimum sintering condition of 1400° C. to 1700° C.

Nevertheless, with the sintered body target having a low density outside the scope of the present invention, the result was the generation of numerous particles.

Accordingly, the advantages yielded by the embodiments of the present invention are evident, and it is clear that the present invention possesses superior characteristics.

With the high density $SrRuO_3$ conductive oxide sintered body target having a relative density of 93% or more, since the pore figuration in the target is of a closed pore (no remaining open pores), abrasive cutting powder or the like will not remain during the target processing, and it is thereby possible to significantly reduce the generation of particles upon forming a thin film for the electrode with sputtering.

Moreover, a high density target yields an effect of reducing the resistivity, and provides a significant advantage in that the production yield can be improved without generating cracks or chips during the manufacturing process, operation or sputtering. Further, there is also a superior effect in that the production cost will improve since the sputtering power can be increased during sputtering.

The invention claimed is:

1. A sintered body, comprising a $SrRuO_3$ conductive oxide sintered body containing an amount greater than 0.5 mol % and no greater than 1.2 mol % of $Bi_2O_3$ and having a relative density of 93% or more.

2. A conductive oxide sintered body according to claim 1, wherein the sintered body has a resistivity of 500 μΩcm or less.

3. A conductive oxide sintered body according to claim 1, wherein the sintered body has a resistivity of 300 μΩcm or less.

4. A sputtering target, comprising a $SrRuO_3$ conductive oxide sintered body containing an amount greater than 0.5 mol % and no greater than 1.2 mol % of $Bi_2O_3$ and having a relative density of 93% or more.

5. A sputtering target according to claim 4, wherein the sputtering target has a resistivity of 500 μΩcm or less.

6. A sputtering target according to claim 4, wherein the sputtering target has a resistivity of 300 μΩcm or less.

7. A manufacturing method of a $SrRuO_3$ conductive oxide sintered body or a sputtering target formed from said sintered body, comprising the step of adding an amount greater than 0.5 mol % and no greater than 1.2 mol % of $Bi_2O_3$ as a sintering auxiliary upon manufacturing the $SrRuO_3$ conductive oxide sintered body.

8. A method according to claim 7, further comprising the step of sintering at a temperature of 1400 to 1700° C. upon manufacturing the $SrRuO_3$ conductive oxide sintered body.

9. A method according to claim 8, wherein said temperature during said sintering is 1600 to 1700° C.

10. A method according to claim 8, further comprising the step of CIP (cold isostatic pressing) molding before said sintering step upon manufacturing the $SrRuO_3$ conductive oxide sintered body.

11. A method according to claim 10, wherein said CIP molding is at a pressure of 1500 kg/cm².

12. A method according to claim 8, wherein said sintered body is set inside a vented alumina container during said sintering step.

* * * * *